United States Patent
Katrak et al.

(10) Patent No.: US 10,564,226 B2
(45) Date of Patent: Feb. 18, 2020

(54) DIAGNOSTIC SYSTEM FOR A DC-DC VOLTAGE CONVERTER

(71) Applicant: LG Chem, Ltd., Seoul (KR)

(72) Inventors: Kerfegar K. Katrak, Fenton, MI (US); Mehdi Rexha, Sterling Heights, MI (US); Chieh-Kai Chang, Grosse Pointe Woods, MI (US)

(73) Assignee: LG Chem, Ltd., Seoul (KR)

( * ) Notice: Subject to any disclaimer, the term of this patent is extended or adjusted under 35 U.S.C. 154(b) by 228 days.

(21) Appl. No.: 15/808,967

(22) Filed: Nov. 10, 2017

(65) Prior Publication Data

US 2018/0149711 A1 May 31, 2018

Related U.S. Application Data

(60) Provisional application No. 62/426,401, filed on Nov. 25, 2016.

(51) Int. Cl.
*G01R 31/40* (2014.01)
*H02M 3/158* (2006.01)
(Continued)

(52) U.S. Cl.
CPC ............ *G01R 31/40* (2013.01); *H02M 3/158* (2013.01); *H02M 3/1582* (2013.01);
(Continued)

(58) Field of Classification Search
None
See application file for complete search history.

(56) References Cited

U.S. PATENT DOCUMENTS 9,759,784 B2 9/2017 Lachaize et al.
2011/0181255 A1 7/2011 Hashimoto et al.
(Continued)

FOREIGN PATENT DOCUMENTS

EP 0865055 A1 9/1998
JP S5642453 A 4/1981
(Continued)

OTHER PUBLICATIONS

Sakai et al. ; Load Driving Circuit; Date of publication: Sep. 16, 1998; The Nippon Signal Co. Ltd.; EP O 865 055 A1; (Year: 1998).*
(Continued)

*Primary Examiner* — Nasima Monsur
(74) *Attorney, Agent, or Firm* — Buckert Patent & Trademark Law Firm PC; John F. Buckert

(57) ABSTRACT

A diagnostic system for a DC-DC voltage converter having a high voltage switch, a low voltage switch, and a DC-DC voltage converter control circuit is provided. The system includes first and second tri-state buffer ICs and a microcontroller. The first tri-state buffer IC receives a first shutdown indicator voltage from the DC-DC voltage converter control circuit indicating that a first plurality of FET switches in a high side FET IC and a second plurality of FET switches in a low side FET IC have been transitioned to an open operational state. The first tri-state buffer IC outputs a second shutdown indicator voltage to the microcontroller that indicates that the first and second plurality of FET switches have been transitioned to the open operational state.

6 Claims, 7 Drawing Sheets

(51) Int. Cl.
*H03K 17/20* (2006.01)
*H03K 17/18* (2006.01)
*H03K 17/687* (2006.01)
*H03K 19/00* (2006.01)

(52) U.S. Cl.
CPC ............ *H03K 17/18* (2013.01); *H03K 17/20* (2013.01); *H03K 17/6871* (2013.01); *H03K 19/0002* (2013.01); *H03K 2217/0063* (2013.01); *H03K 2217/0072* (2013.01)

(56) References Cited

U.S. PATENT DOCUMENTS

| | | |
|---|---|---|
| 2011/0187336 A1 | 8/2011 | Wu et al. |
| 2011/0215751 A1 | 9/2011 | Sato |
| 2014/0028271 A1* | 1/2014 | Kondou ................ H02M 3/156 323/271 |
| 2014/0077775 A1 | 3/2014 | Gotou |
| 2015/0180355 A1* | 6/2015 | Freeman ................ H02M 1/08 363/21.04 |

FOREIGN PATENT DOCUMENTS

| | | |
|---|---|---|
| JP | 2005168229 A | 6/2005 |
| JP | 2011152011 A | 8/2011 |
| JP | 5064367 B2 | 10/2012 |
| JP | 2014064354 A | 4/2014 |
| JP | 2015047040 A | 3/2015 |
| KR | 20110089094 A | 8/2011 |
| KR | 20150049061 A | 5/2015 |
| KR | 20160036793 A | 4/2016 |
| KR | 1020160036793 A | 4/2016 |
| KR | 20160049334 A | 5/2016 |

OTHER PUBLICATIONS

U.S. Appl. No. 15/246,887, filed Aug. 25, 2016 entitled Diagnostic System for a DC-DC Voltage Converter.
U.S. Appl. No. 15/249,376, filed Aug. 27, 2016 entitled Diagnostic System for a DC-DC Voltage Converter.
U.S. Appl. No. 15/646,155, filed Jul. 11, 2017 entitled Diagnostic System for a DC-DC Voltage Converter.
U.S. Appl. No. 15/247,087, filed Aug. 25, 2016 entitled Diagnostic System for a DC-DC Voltage Converter.

* cited by examiner

DIAGNOSTIC SYSTEM FOR A DC-DC VOLTAGE CONVERTER

CROSS-REFERENCE TO RELATED APPLICATION

This application claims priority to U.S. Provisional Patent Application No. 62/426,401 filed on Nov. 25, 2016, the entire contents of which are hereby incorporated by reference herein.

BACKGROUND

The inventor herein has recognized a need for an improved diagnostic system for a DC-DC voltage converter that utilizes a pair of tri-state buffer ICs to independently control switches and integrated circuits in the DC-DC voltage converter, and to receive diagnostic signals from the DC-DC voltage converter.

SUMMARY

A diagnostic system for a DC-DC voltage converter in accordance with an exemplary embodiment is provided. The DC-DC voltage converter has a high voltage switch, a low voltage switch, and a DC-DC voltage converter control circuit. The high voltage switch is electrically coupled between and to first and second electrical nodes. The low voltage switch is electrically coupled between and to third and fourth electrical nodes. The DC-DC voltage converter control circuit is electrically coupled between and to the second and third electrical nodes. The DC-DC voltage converter control circuit has a high side FET IC and a low side FET IC. The high side FET IC has a first plurality of FET switches therein. The low side FET IC has a second plurality of FET switches therein. Each FET switch of the first plurality of FET switches is electrically coupled to a respective FET switch of the second plurality of FET switches. The diagnostic system includes a first tri-state buffer IC having first and second pins. The diagnostic system further includes a second tri-state buffer IC having first and second pins. The diagnostic system further includes a microcontroller that is electrically coupled to the first and second tri-state buffer ICs. The first tri-state buffer IC receives a first shutdown indicator voltage at the first pin thereof from the DC-DC voltage converter control circuit indicating that the first plurality of FET switches in the high side FET IC and the second plurality of FET switches in the low side FET IC have been transitioned to an open operational state. The first tri-state buffer IC outputs a second shutdown indicator voltage at the second pin thereof in response to receiving the first shutdown indicator voltage. The second shutdown indicator voltage is received by the microcontroller and indicates that the first plurality of FET switches in the high side FET IC and the second plurality of FET switches in the low side FET IC have been transitioned to the open operational state. The second tri-state buffer IC receives a third shutdown indicator voltage at the first pin thereof from the DC-DC voltage converter control circuit indicating that the first plurality of FET switches in the high side FET IC and the second plurality of FET switches in the low side FET IC have been transitioned to the open operational state. The second tri-state buffer IC outputs a fourth shutdown indicator voltage at the second pin thereof in response to receiving the third shutdown indicator voltage. The fourth shutdown indicator voltage is received by the microcontroller and indicates that the first plurality of FET switches in the high side FET IC and the second plurality of FET switches in the low side FET IC have been transitioned to the open operational state. The microcontroller stores a shutdown indicator flag in a memory device indicating that the first plurality of FET switches in the high side FET IC and the second plurality of FET switches in the low side FET IC have been transitioned to the open operational state, in response to receiving at least one of the second and fourth shutdown indicator voltages.

A diagnostic system for a DC-DC voltage converter in accordance with another exemplary embodiment is provided. The DC-DC voltage converter has a high voltage switch, a low voltage switch, and a DC-DC voltage converter control circuit. The high voltage switch is electrically coupled between and to first and second electrical nodes. The low voltage switch is electrically coupled between and to third and fourth electrical nodes. The DC-DC voltage converter control circuit is electrically coupled between and to the second and third electrical nodes. The DC-DC voltage converter control circuit has a high side FET IC and a low side FET IC. The high side FET IC has a first plurality of FET switches therein. The low side FET IC has a second plurality of FET switches therein. Each FET switch of the first plurality of FET switches is electrically coupled to a respective FET switch of the second plurality of FET switches. The diagnostic system includes a first tri-state buffer IC having first and second pins. The diagnostic system further includes a second tri-state buffer IC having first and second pins. The diagnostic system further includes a microcontroller that is electrically coupled to the first and second tri-state buffer ICs. The first tri-state buffer IC receives a first electrical short circuit indicator voltage at the first pin thereof from the DC-DC voltage converter control circuit indicating that a first FET switch in one of the first plurality of FET switches in the high side FET IC and the second plurality of FET switches in the low side FET IC has a short circuit condition. The first tri-state buffer IC outputs a second electrical short circuit indicator voltage at the second pin thereof in response to receiving the first electrical short circuit indicator voltage. The second electrical short circuit indicator voltage is received by the microcontroller and indicates that the first FET switch in one of the first plurality of FET switches in the high side FET IC and the second plurality of FET switches in the low side FET IC has the short circuit condition. The second tri-state buffer IC receives a third electrical short circuit indicator voltage at the first pin thereof from the DC-DC voltage converter control circuit indicating that the first FET switch in one of the first plurality of FET switches in the high side FET IC and the second plurality of FET switches in the low side FET IC has the short circuit condition. The second tri-state buffer IC outputs a fourth electrical short circuit indicator voltage at the second pin thereof in response to receiving the third electrical short circuit indicator voltage. The fourth electrical short circuit indicator voltage is received by the microcontroller and indicates that the first FET switch in one of the first plurality of FET switches in the high side FET IC and the second plurality of FET switches in the low side FET IC has the short circuit condition. The microcontroller stores an electrical short indicator flag in a memory device indicating that the first FET switch in one of the first plurality of FET switches in the high side FET IC and the second plurality of FET switches in the low side FET IC has the short circuit condition, in response to receiving at least one of the second and fourth electrical short circuit indicator voltages.

A diagnostic system for a DC-DC voltage converter in accordance with another exemplary embodiment is provided. The DC-DC voltage converter has a high voltage switch, a low voltage switch, and a DC-DC voltage converter control circuit. The high voltage switch is electrically coupled between and to first and second electrical nodes. The low voltage switch is electrically coupled between and to third and fourth electrical nodes. The DC-DC voltage converter control circuit is electrically coupled between and to second and third electrical nodes. The DC-DC voltage converter control circuit has a boost mode IC and a buck mode IC. The diagnostic system includes a first tri-state buffer IC having first and second pins. The diagnostic system further includes a second tri-state buffer IC having first and second pins. The diagnostic system further includes a microcontroller that is electrically coupled to the first and second tri-state buffer ICs. The microcontroller generates a first control voltage that is received at the first pin of the first tri-state buffer IC for commanding the boost mode IC in the DC-DC voltage converter to be activated. The first tri-state buffer IC outputs a second control voltage at the second pin thereof in response to receiving the first control voltage. The second control voltage is received by the boost mode IC to induce the boost mode IC to be activated at a first time, when the buck mode IC is not activated. The microcontroller generates a third control voltage that is received at the first pin of the second tri-state buffer IC for commanding the buck mode IC in the DC-DC voltage converter to be activated. The second tri-state buffer IC outputs a fourth control voltage at the second pin thereof in response to receiving the third control voltage. The fourth control voltage is received by the buck mode IC to induce the buck mode IC to be activated at a second time, when the boost mode IC is not activated.

DETAILED DESCRIPTION

Figure 1:
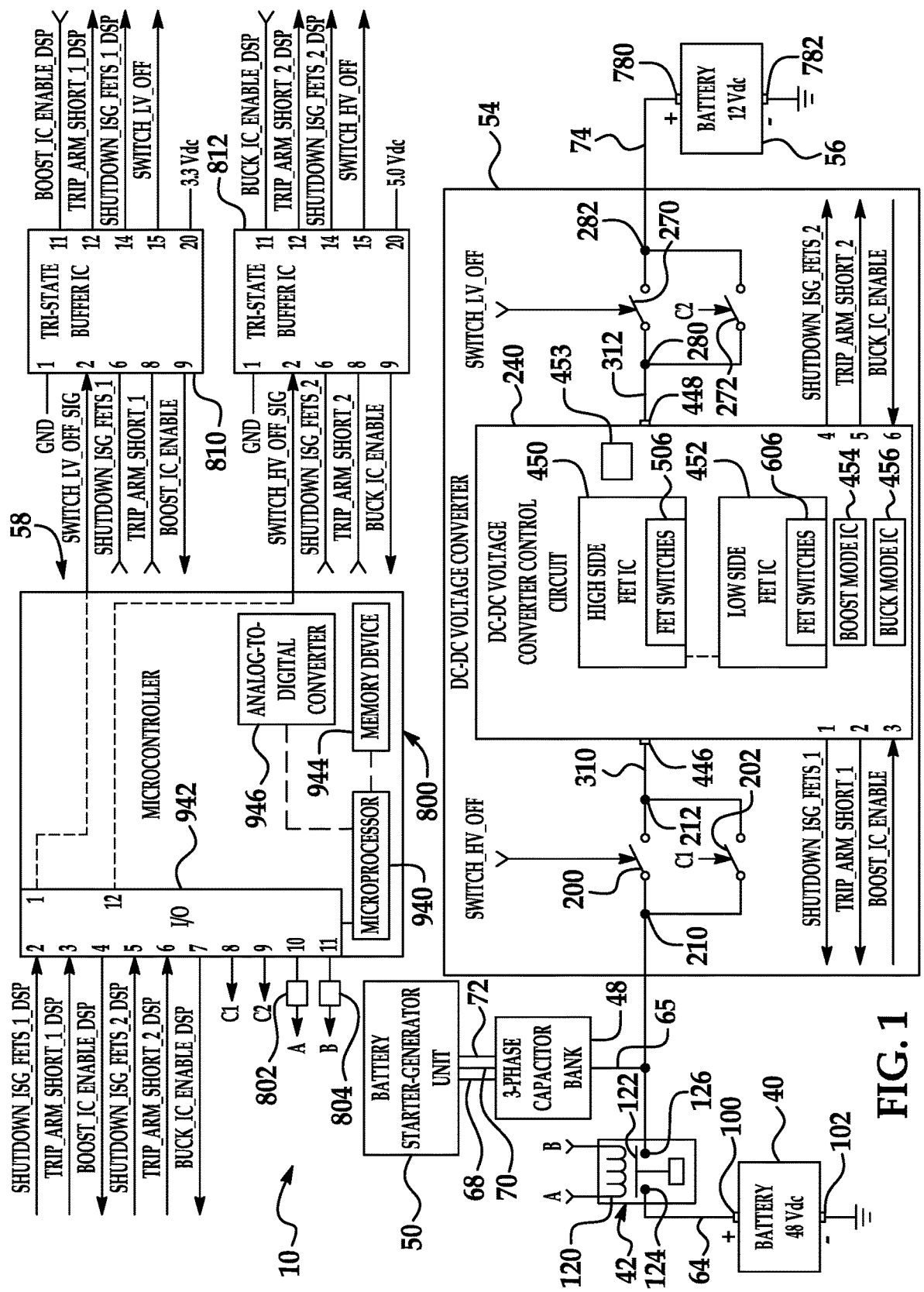
FIG. 1 is a schematic of a vehicle having a diagnostic system for a DC-DC voltage converter in accordance with an exemplary embodiment.

Referring to FIG. 1, a vehicle 10 is provided. The vehicle 10 includes a battery 40, a contactor 42, a 3-phase capacitor bank 48, a battery-starter generator unit 50, a DC-DC voltage converter 54, a battery 56, a diagnostic system 58, and electrical lines 64, 65, 68, 70, 72, 74.

An advantage of the diagnostic system 58 is that the diagnostic system 58 utilizes two tri-state buffers to independently control switches and integrated circuits in the DC-DC voltage converter 54.

For purposes of understanding, some of the terms utilized herein will be described.

The term "node" or "electrical node" is a region or a location in an electrical circuit.

The term "signal" refers to one of an electrical voltage, an electrical current, and a binary value.

The term "IC" refers to an integrated circuit.

The term "FET" refers to a field-effect transistor.

The term "FET switches" refers to a plurality of FET switches herein.

The term "boost operational mode" refers to an operational mode of the DC-DC voltage converter 54 in which the DC-DC voltage converter 54 applies a voltage to the 3-phase capacitor bank 48. In an exemplary embodiment, when the DC-DC voltage converter 54 has the boost operational mode, the contactor 42 has an open operational state, the high voltage switch 200 has a closed operational state, the pre-charge high voltage switch 202 has a closed operational state, the FET switches 506, 606 are switched as desired, the low voltage switch 270 has a closed operational state, and the pre-charge low voltage switch 272 has a closed operational state.

The term "high logic level" corresponds to a voltage level associated with a binary "1", and the term "low logic level" corresponds to a voltage level associated with a binary "0."

The term "tri-state buffer IC" refers a buffer IC that can have one of three states at each pin thereof. When the tri-state buffer IC receives an input signal within a first voltage range, the tri-state buffer IC outputs an associated signal at a low logic level. Further, when the tri-state buffer IC receives an input signal within a second voltage range, the tri-state buffer IC outputs an associated signal at a high logic level. Further, when the tri-state buffer IC receives an input signal a third voltage range between the first and second voltage ranges, the tri-state buffer IC does not output a signal.

The battery 40 includes a positive terminal 100 and a negative terminal 102. In an exemplary embodiment, the battery 40 generates 48 Vdc between the positive terminal 100 and the negative terminal 102. The positive terminal 100 is electrically coupled to a first electrical node 124 on a first side of the contactor 42. The negative terminal 102 is electrically coupled to an electrical ground for the battery 40.

The contactor 42 has a contactor coil 120, a contact 122, a first electrical node 124 and a second electrical node 126. The first electrical node 124 is electrically coupled to the positive terminal 100 of the battery 40. The second electrical node 126 is electrically coupled to both the 3-phase capacitor bank 48 and the electrical node 210 of the DC-DC voltage converter 54. When the microcontroller 800 generates first and second control signals that are received by the voltage drivers 802, 804, respectively, the contactor coil 120 is energized which transitions the contact 122 to a closed operational state. Alternately, when the microcontroller 800 generates third and fourth control signals that are received by the voltage drivers 802, 804, respectively, the contactor coil 120 is de-energized which transitions the contact 122 to an open operational state. In an exemplary embodiment, the third and fourth control signals can each be a ground voltage level.

The 3-phase capacitor bank 48 is utilized to store and release electrical energy from the battery starter-generator unit 50, the battery 40, and the DC-DC voltage converter 54. The 3-phase capacitor bank 48 is electrically coupled to the electrical node 126 of the contactor 126 and the electrical node 210 of the DC-DC voltage converter 54 utilizing the electrical line 65. The 3-phase capacitor bank 48 is further electrically coupled to the battery-starter generator 50 utilizing the electrical lines 68, 70, 72.

The battery-starter generator unit 50 is provided to generate an AC voltage that is received by the 3-phase capacitor bank 48 via the electrical lines 68, 70, 72.

The DC-DC voltage converter 54 includes a high voltage switch 200, a pre-charge high voltage switch 202, electrical nodes 210, 212, a DC-DC voltage converter control circuit 240, a low voltage switch 270, a pre-charge low voltage switch 272, electrical nodes 280, 282, and electrical lines 310, 312.

The high voltage switch 200 is electrically coupled between a node 210 and a node 212. The node 212 is electrically coupled to the terminal 446 of the DC-DC voltage converter control circuit 240. The node 210 is electrically coupled to the node 126 of the contactor 42. When the microcontroller 800 generates a control voltage (SWITCH_HV_OFF) having a high logic level that is received by the high voltage switch 200 (or that is received by a controller or a microprocessor within the DC-DC voltage converter 54 that is operably coupled to the switch 200), the microcontroller 800 induces the switch 200 to transition to a closed operational state. When the microcontroller 800 generates the control voltage (SWITCH_HV_OFF) having a low logic level (e.g., ground voltage level), the microcontroller 800 induces the switch 200 to transition to an open operational state. In an exemplary embodiment, the high voltage switch 200 is a FET switch such as a bi-directional MOSFET switch for example.

The pre-charge high voltage switch 202 is electrically coupled between the node 210 and the node 212. When the microcontroller 800 generates a control voltage (C1) having a high logic level that is received by the pre-charge high voltage switch 202 (or that is received by a controller or a microprocessor within the DC-DC voltage converter 54 that is operably coupled to the switch 202), the microcontroller 800 induces the switch 202 to transition to a closed operational state. When the microcontroller 800 generates the control voltage (C1) having a low logic level (e.g., ground voltage level), the microcontroller 800 induces the switch 202 to transition to an open operational state. In an exemplary embodiment, the pre-charge high voltage switch 202 is a FET switch such as a bi-directional MOSFET switch for example.

Figure 2:
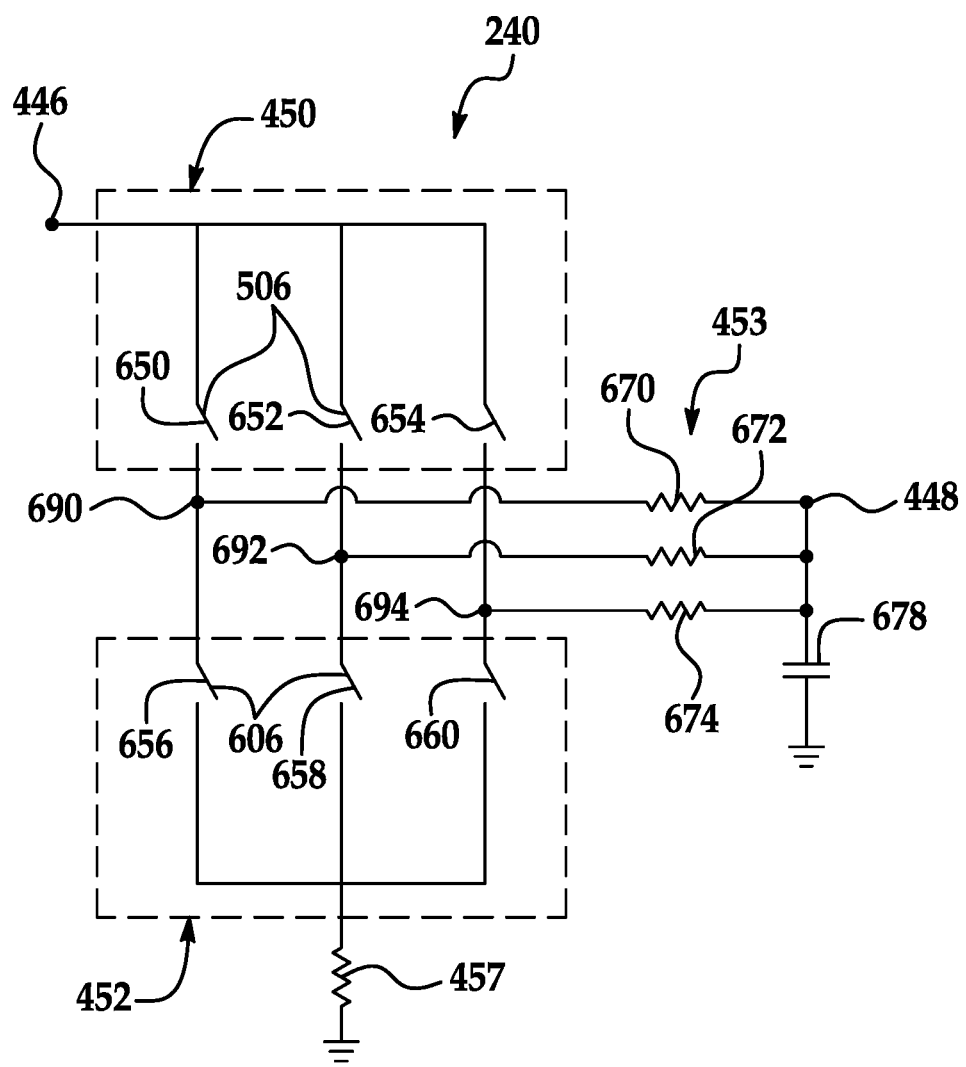
FIG. 2 is a schematic of a portion of a DC-DC voltage converter control circuit utilized in the DC-DC voltage converter of FIG. 1.

Referring to FIGS. 1 and 2, the DC-DC voltage converter control circuit 240 has a terminal 446, a terminal 448, a high side FET IC 450, a low side FET IC 452, an intermediate circuit 453, a boost mode IC 454, a buck mode IC 456, and a resistor 457. The DC-DC voltage converter control circuit 240 can convert a DC voltage received at the terminal 446 to another DC voltage that is output at the terminal 448. Alternately, the DC-DC voltage converter control circuit 240 can convert a DC voltage received at the terminal 448 to another DC voltage that is output at the terminal 446.

The high side FET IC 450 includes a plurality of FET switches 506 therein whose operational state (e.g., closed operational state or open operational state) is controlled by control voltages received by the DC-DC voltage converter control circuit 240. In an exemplary embodiment, the plurality of FET switches 506 includes FET switches 650, 652, 654 which are electrically coupled at a first end to the terminal 446. The FET switch 650 is electrically coupled between the terminal 446 and the node 690, and is further electrically coupled in series with the FET switch 656 of the low side FET IC 452. The FET switch 652 is electrically coupled between the terminal 446 and the node 692, and is further electrically coupled in series with the FET switch 658 of the low side FET IC 452. The FET switch 654 is electrically coupled between the terminal 446 and the node 694, and further electrically coupled in series with the FET switch 660 of the low side FET IC 452.

The low side FET IC 452 includes a plurality of FET switches 606 therein whose operational state (e.g., closed operational state or open operational state) is controlled by control voltages received by the DC-DC voltage converter control circuit 240. In an exemplary embodiment, the plurality of FET switches 606 includes FET switches 656, 658, 660. The FET switch 656 is electrically coupled between the node 690 and a resistor 457, and is further electrically coupled in series with the FET switch 650 of the high side FET IC 450. The FET switch 658 is electrically coupled between the node 692 and the resistor 457, and is further electrically coupled in series with the FET switch 652 of the high side FET IC 450. The FET switch 660 is electrically coupled between the node 694 and the resistor 457, and is further electrically coupled in series with the FET switch 654 of the high side FET IC 450. The resistor 457 is further electrically coupled to the electrical ground of the battery 40.

The intermediate circuit 453 includes resistors 670, 672, 674 and a capacitor 678. The resistor 670 is electrically coupled between the node 690 and the terminal 448. The resistor 672 is electrically coupled between the node 692 and the terminal 448. Further, the resistor 674 is electrically coupled between the node 694 and the terminal 448. The capacitor 678 is electrically coupled between the terminal 448 and the electrical ground of the battery 56.

The boost mode IC 454 is operably coupled to the FET switches 506 and 606 and is provided to control the FET switches 506 and 606 during the boost operational mode of the DC-DC voltage converter 54.

The buck mode IC 454 is operably coupled to the FET switches 506 and 606 and is provided to control the FET switches 506 and 606 during the buck operational mode of the DC-DC voltage converter 54.

Referring to FIG. 1, the low voltage switch 270 is electrically coupled in parallel to the pre-charge low voltage switch 272 between and to electrical nodes 280, 282. When the microcontroller 800 generates a control voltage (SWITCH_LV_OFF) having a high logic level that is received by the low voltage switch 270 (or that is received by a controller or a microprocessor within the DC-DC voltage converter 54 that is operably coupled to the switch 270), the microcontroller 800 induces the switch 270 to transition to a closed operational state. When the microcontroller 800 generates the control voltage (SWITCH_LV_OFF) having a low logic level (e.g., ground voltage level), the microcontroller 800 induces the switch 270 to transition to an open operational state. In an exemplary embodiment, the low voltage switch 270 is a FET switch such as a bi-directional MOSFET switch for example.

The pre-charge low voltage switch 272 is electrically coupled between and to electrical nodes 280, 282. When the microcontroller 800 generates a control voltage (C2) having a high logic level that is received by the pre-charge low voltage switch 272 (or that is received by a controller or a microprocessor within the DC-DC voltage converter 54 that is operably coupled to the switch 272), the microcontroller 800 induces the switch 272 to transition to a closed operational state. When the microcontroller 800 generates the control voltage (C2) having a low logic level (e.g., ground voltage level), the microcontroller 800 induces the switch 272 to transition to an open operational state. In an exemplary embodiment, the pre-charge low voltage switch 272 is a FET switch such as a bi-directional MOSFET switch for example.

The battery 56 includes a positive terminal 780 and a negative terminal 782. In an exemplary embodiment, the battery 56 generates 12 Vdc between the positive terminal 780 and the negative terminal 782. The positive terminal 780 is electrically coupled to the electrical node 282 of the DC-DC voltage converter 54. The negative terminal 782 is electrically coupled to an electrical ground for the battery 56, which may be different that the electrical ground that the battery 40 is coupled to.

The diagnostic system 58 is utilized to control the shutdown operations of the DC-DC voltage converter 54 when the diagnostic system 58 detects undesired operation of the DC-DC voltage converter 54. The diagnostic system 58 includes the microcontroller 800, the voltage drivers 802, 804, and the tri-state buffers 810, 812.

The microcontroller 800 includes a microprocessor 940, the input-output (I/O) device 942, a memory device 944, and an analog-to-digital converter 946. The microprocessor 940 is operably coupled to the I/O device 942, the memory device 944, and the analog-to-digital converter 946, the DC-DC voltage converter 54, and the voltage drivers 802, 804.

The tri-state buffer IC 810 is provided to receive control voltages from the microcontroller 800 and to output associated control voltages therefrom within a predetermined voltage range (e.g., 0-3.3 Vdc). The tri-state buffer IC 810 is provided to receive diagnostic signals from the DC-DC voltage converter 54 and to output associated diagnostic signals to the microcontroller 800 within the predetermined voltage range (e.g., 0-3.3 Vdc).

The tri-state buffer IC 810 includes at least pins 1, 2, 6, 8, 9, 11, 12, 14, 15, 20 thereon.

The pin 1 of the tri-state buffer IC 810 is electrically coupled to electrical ground.

The pin 2 of the tri-state buffer IC 810 is electrically coupled to the pin 1 of the I/O device 942 of the microcontroller 800 and receives the control voltage (SWITCH_LV_OFF_SIG). When the control voltage (SWITCH_LV_OFF_SIG) has a low logic level, the control voltage indicates that the low voltage switch 270 is to be transitioned to an open operational state.

The pin 15 of the tri-state buffer IC 810 is electrically coupled to the low voltage switch 270. The pin 15 of the tri-state buffer IC 810 outputs the control voltage (SWITCH_ LV_OFF) at a low logic level in response to the tri-state buffer IC 810 receiving the (SWITCH_LV_OFF_SIG) at a low logic level at pin 2 thereof. The low voltage switch 270 transitions to the open operational state in response to receiving the control voltage (SWITCH_LV_OFF) at the low logic level.

The pin 6 of the tri-state buffer IC 810 is electrically coupled to the pin 1 of the DC-DC voltage converter control circuit 240, and receives the shutdown indicator voltage (SHUTDOWN_ISG_FETS_1) from the pin 1 of the DC-DC voltage converter control circuit 240. When the shutdown indicator voltage (SHUTDOWN_ISG_FETS_1) has the high logic level, the shutdown indicator voltage (SHUTDOWN_ISG_FETS_1) indicates that the plurality of FET switches 506 in the high side FET IC 450 have been transitioned to an open operational state, and the plurality of FET switches 606 in the low side FET IC 452 have been transitioned to the open operational state.

The pin 14 of the tri-state buffer IC 810 is electrically coupled to the pin 2 of the I/O device 942 of the microcontroller 800 and outputs the shutdown indicator voltage (SHUTDOWN_ISG_FETS_1_DSP) having a high logic level, in response to the tri-state buffer IC 810 receiving the shutdown indicator voltage (SHUTDOWN_ISG_FETS_1) at the high logic level. When the shutdown indicator voltage (SHUTDOWN_ISG_FETS_1_DSP) has the high logic level, the shutdown indicator voltage (SHUTDOWN_ISG_FETS_1_DSP) indicates that the plurality of FET switches 506 in the high side FET IC 450 have been transitioned to the open operational state, and the plurality of FET switches 606 in the low side FET IC 452 have been transitioned to the open operational state.

The pin 8 of the tri-state buffer IC 810 is electrically coupled to the pin 2 of the DC-DC voltage converter control circuit 240, and receives the electrical short indicator voltage (TRIP_ARM_SHORT_1) from the pin 2 of the DC-DC voltage converter control circuit 240. When the electrical short indicator voltage (TRIP_ARM_SHORT_1) has the high logic level, the electrical short indicator voltage (TRIP_ARM_SHORT_1) indicates that at least one FET in the plurality of FET switches 506 and the plurality of FET switches 606 has a short circuit condition to electrical ground.

The pin 12 of the tri-state buffer IC 810 is electrically coupled to the pin 3 of the I/O device 942 of the microcontroller 800 and outputs the electrical short indicator voltage (TRIP_ARM_SHORT_1_DSP) having a high logic level, in response to the tri-state buffer IC 810 receiving the electrical short indicator voltage (TRIP_ARM_SHORT_1) at the high logic level. When the electrical short indicator voltage (TRIP_ARM_SHORT_1_DSP) has the high logic level, the electrical short indicator voltage (TRIP_ARM_SHORT_1_DSP) indicates that at least one FET in the plurality of FET switches 506 and the plurality of FET switches 606 has a short circuit condition to electrical ground.

The pin 11 of the tri-state buffer IC 810 is electrically coupled to the pin 4 of the I/O device 942 of the microcontroller 800, and receives the control voltage (BOOST_IC_ENABLE_DSP) from the I/O device 942. When the control voltage (BOOST_IC_ENABLE_DSP) has the high logic level, the control voltage (BOOST_IC_ENABLE_DSP) indicates that boost mode IC 454 is to be activated such that the DC-DC voltage converter 54 is operated in the boost operational mode.

The pin 9 of the tri-state buffer IC 810 is electrically coupled to the DC-DC voltage converter control circuit 240 and outputs the control voltage (BOOST_IC_ENABLE) having a high logic level, in response to the tri-state buffer IC 810 receiving the control voltage (BOOST_IC_ENABLE_DSP) at the high logic level. When the control voltage (BOOST_IC_ENABLE_DSP) has the high logic level, the control voltage (BOOST_IC_ENABLE_DSP) commands the boost mode IC to be activated for operating the FET switches 506 and 606 in a boost operational mode.

The tri-state buffer IC 812 is provided to receive control voltages from the microcontroller 800 and to output associated control voltages therefrom within another predetermined voltage range (e.g., 0-5.0 Vdc). The tri-state buffer IC 812 is provided to receive diagnostic signals from the DC-DC voltage converter 54 and to output associated diagnostic signals to the microcontroller 800 within the other predetermined voltage range (e.g., 0-5.0 Vdc). The tri-state buffer IC 812 includes at least pins 1, 2, 6, 8, 9, 11, 12, 14, 15, 20.

The pin 1 of the tri-state buffer IC 812 is electrically coupled to electrical ground.

The pin 2 of the tri-state buffer IC 812 is electrically coupled to the pin 12 of the I/O device 942 of the microcontroller 800 and receives the control voltage (SWITCH_

HV_OFF_SIG). When the control voltage (SWITCH_HV_OFF_SIG) has a low logic level, the control voltage indicates that the high voltage switch 200 is to be transitioned to an open operational state.

The pin 15 of the tri-state buffer IC 812 is electrically coupled to the high voltage switch 200. The pin 15 of the tri-state buffer IC 812 outputs the control voltage (SWITCH_HV_OFF) at a low logic level in response to the tri-state buffer IC 812 receiving the (SWITCH_HV_OFF_SIG) at pin 2 thereof. The high voltage switch 200 transitions to the open operational state in response to receiving the control voltage (SWITCH_HV_OFF) at the low logic level.

The pin 6 of the tri-state buffer IC 812 is electrically coupled to the pin 4 of the DC-DC voltage converter control circuit 240, and receives the shutdown indicator voltage (SHUTDOWN_ISG_FETS_2) from the pin 4 of the DC-DC voltage converter control circuit 240. When the shutdown indicator voltage (SHUTDOWN_ISG_FETS_2) has the high logic level, the shutdown indicator voltage (SHUTDOWN_ISG_FETS_2) indicates that the plurality of FET switches 506 in the high side FET IC 450 have been transitioned to the open operational state, and the plurality of FET switches 606 in the low side FET IC 452 have been transitioned to the open operational state.

The pin 14 of the tri-state buffer IC 812 is electrically coupled to the pin 5 of the I/O device 942 of the microcontroller 800 and outputs the shutdown indicator voltage (SHUTDOWN_ISG_FETS_2_DSP), in response to the tri-state buffer IC 812 receiving the shutdown indicator voltage (SHUTDOWN_ISG_FETS_2) at the high logic level. When the shutdown indicator voltage (SHUTDOWN_ISG_FETS_2_DSP) has the high logic level, the shutdown indicator voltage (SHUTDOWN_ISG_FETS_2_DSP) indicates that the plurality of FET switches 506 in the high side FET IC 450 have been transitioned to the open operational state, and the plurality of FET switches 606 in the low side FET IC 452 have been transitioned to the open operational state.

The pin 8 of the tri-state buffer IC 812 is electrically coupled to the pin 5 of the DC-DC voltage converter control circuit 240, and receives the electrical short indicator voltage (TRIP_ARM_SHORT_2) from the pin 5 of the DC-DC voltage converter control circuit 240. When the electrical short indicator voltage (TRIP_ARM_SHORT_2) has the high logic level, the electrical short indicator voltage (TRIP_ARM_SHORT_2) indicates that at least one FET in the plurality of FET switches 506 and the plurality of FET switches 606 has a short circuit condition to electrical ground.

The pin 12 of the tri-state buffer IC 810 is electrically coupled to the pin 6 of the I/O device 942 of the microcontroller 800 and outputs the electrical short indicator voltage (TRIP_ARM_SHORT_2_DSP) having a high logic level, in response to the tri-state buffer IC 812 receiving the electrical short indicator voltage (TRIP_ARM_SHORT_2) at the high logic level. When the electrical short indicator voltage (TRIP_ARM_SHORT_2_DSP) has the high logic level, the electrical short indicator voltage (TRIP_ARM_SHORT_2_DSP) indicates that at least one FET in the plurality of FET switches 506 and the plurality of FET switches 606 has a short circuit condition to electrical ground.

The pin 11 of the tri-state buffer IC 812 is electrically coupled to the pin 7 of the I/O device 942 of the microcontroller 800, and receives the control voltage (BUCK_IC_ENABLE_DSP) from the I/O device 942. When the control voltage (BUCK_IC_ENABLE_DSP) has the high logic level, the control voltage (BUCK_IC_ENABLE_DSP) indicates that buck mode IC 456 is to be activated such that the DC-DC voltage converter 54 is to be operated in the buck operational mode.

The pin 9 of the tri-state buffer IC 812 is electrically coupled to the pin 6 of the DC-DC voltage converter control circuit 240 and outputs the control voltage (BUCK_IC_ENABLE) having a high logic level, in response to the tri-state buffer IC 812 receiving the control voltage (BUCK_IC_ENABLE_DSP) at the high logic level. When the control voltage (BUCK_IC_ENABLE_DSP) has the high logic level, the control voltage (BUCK_IC_ENABLE_DSP) commands the buck mode IC to be activated for operating the FET switches 506 and 606 in a buck operational mode.

Figure 3:
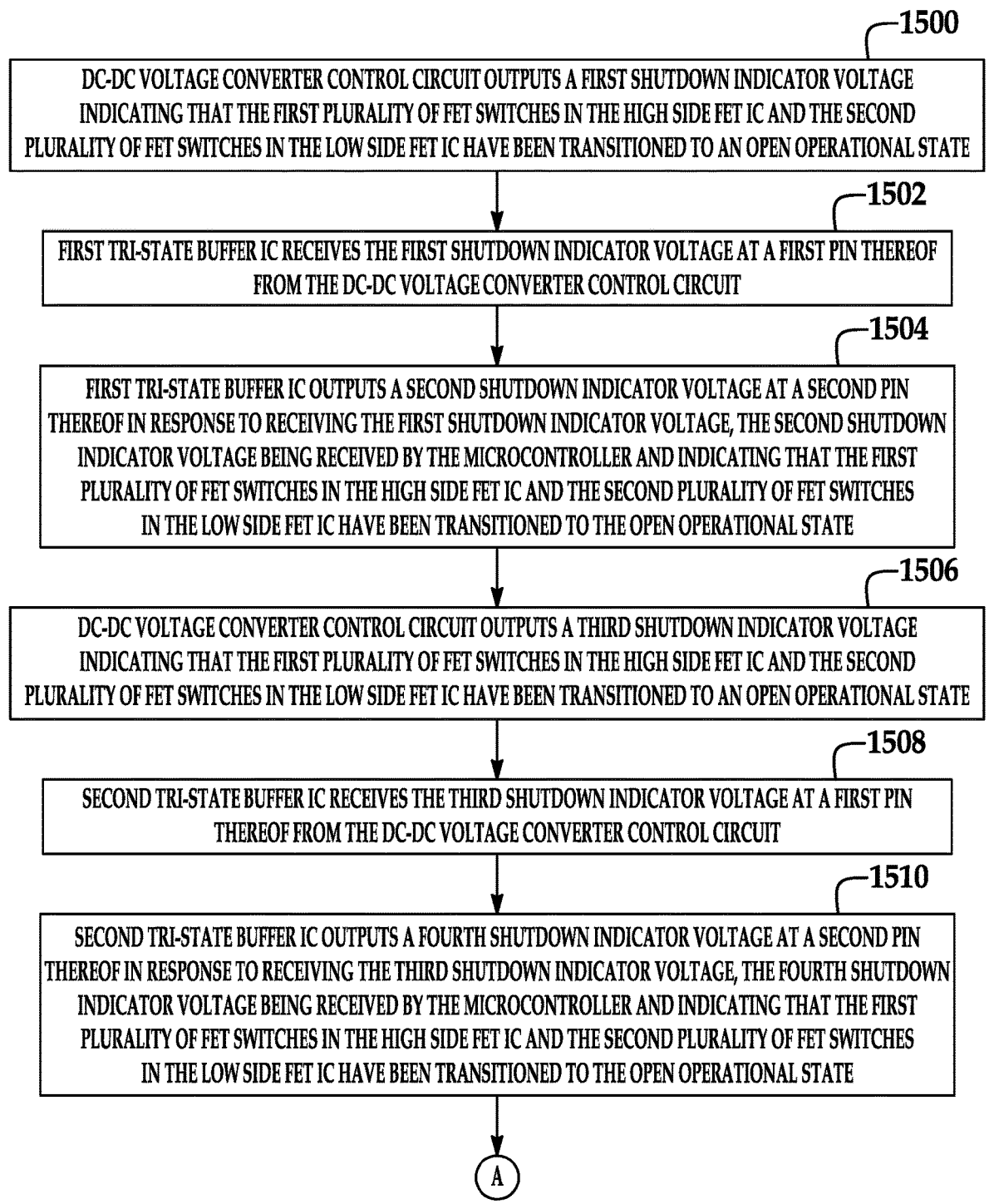
FIGS. 3-4 is a flowchart of a first diagnostic method performed by the diagnostic system of FIG. 1 in accordance with another exemplary embodiment.
Figure 4:
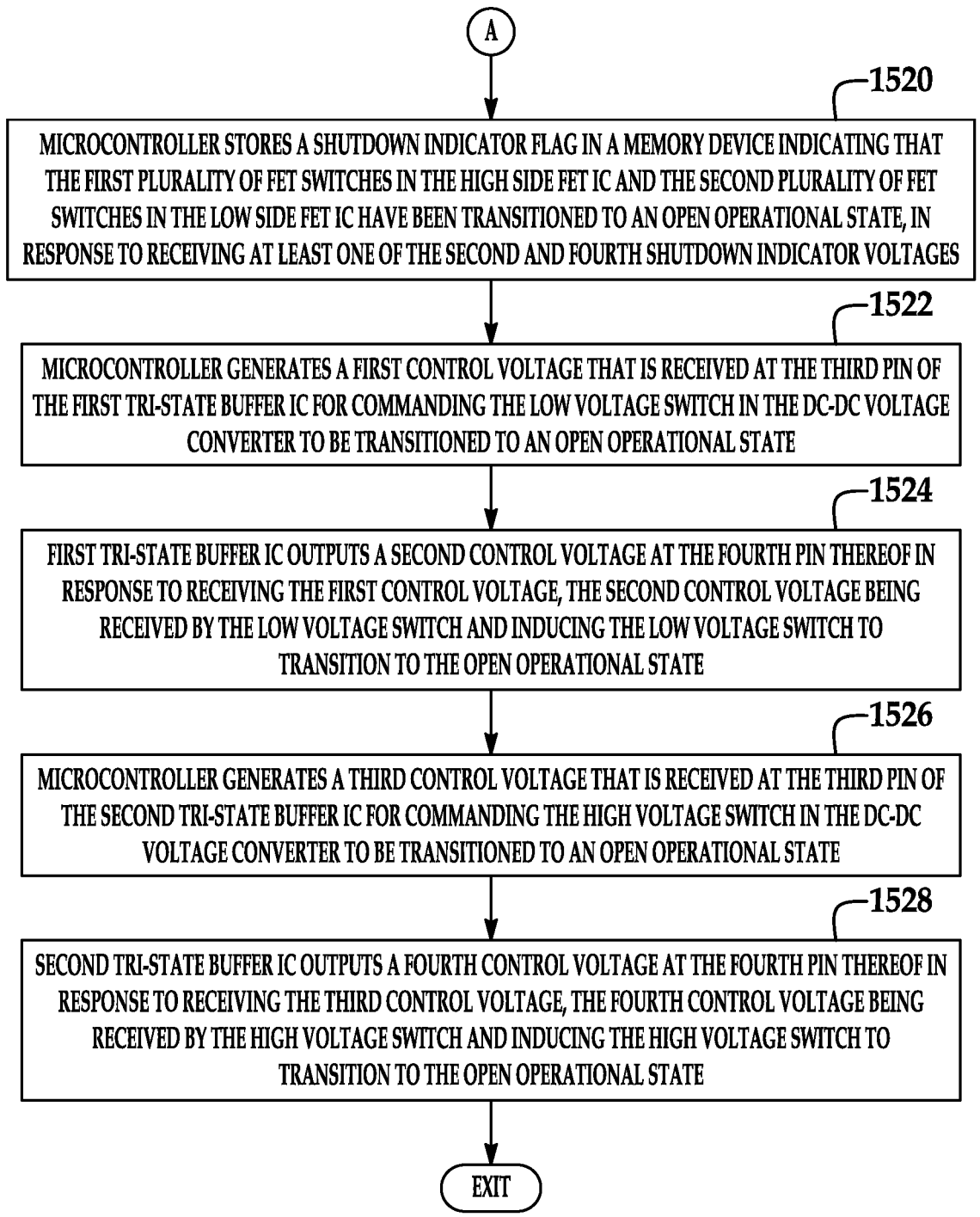

Referring to FIGS. 1, 3 and 4, a flowchart of a first diagnostic method for the DC-DC voltage converter 54 in accordance with another exemplary embodiment will be explained.

At step 1500, the DC-DC voltage converter control circuit 240 outputs a first shutdown indicator voltage (SHUTDOWN_ISG_FETS_1) indicating that the plurality of FET switches 506 in the high side FET IC 450 and the plurality of FET switches 606 in the low side FET IC 452 have been transitioned to an open operational state. After step 1500, the method advances to step 1502.

At step 1502, the tri-state buffer IC 810 receives the first shutdown indicator voltage (SHUTDOWN_ISG_FETS_1) at the pin 6 thereof from the DC-DC voltage converter control circuit 240. After step 1502, the method advances to step 1504.

At step 1504, the tri-state buffer IC 810 outputs a second shutdown indicator voltage (SHUTDOWN_ISG_FETS_1_DSP) at the pin 14 thereof in response to receiving the first shutdown indicator voltage (SHUTDOWN_ISG_FETS_1). The second shutdown indicator voltage (SHUTDOWN_ISG_FETS_1_DSP) is received by the microcontroller 800 and indicates that the plurality of FET switches 506 in the high side FET IC 450 and the plurality of FET switches 606 in the low side FET IC 452 have been transitioned to the open operational state. After step 1504, the method advances to step 1506.

At step 1506, the DC-DC voltage converter control circuit 240 outputs a third shutdown indicator voltage (SHUTDOWN_ISG_FETS_2) indicating that the plurality of FET switches 506 in the high side FET IC 450 and the plurality of FET switches 606 in the low side FET IC 452 have been transitioned to the open operational state. After step 1506, the method advances to step 1508.

At step 1508, the tri-state buffer IC 812 receives the third shutdown indicator voltage (SHUTDOWN_ISG_FETS_2) at the pin 6 thereof from the DC-DC voltage converter control circuit 240. After step 1500, the method advances to step 1510.

At step 1510, the tri-state buffer IC 812 outputs a fourth shutdown indicator voltage (SHUTDOWN_ISG_FETS_2_DSP) at the pin 14 thereof in response to receiving the third shutdown indicator voltage (SHUTDOWN_ISG_FETS_2). The fourth shutdown indicator voltage (SHUTDOWN_ISG_FETS_2_DSP) is received by the microcontroller 800 and indicates that the plurality of FET switches 506 in the high side FET IC 450 and the plurality of FET switches 606 in the low side FET IC 452 have been transitioned to the open operational state. After step 1510, the method advances step 1520.

At step 1520, the microcontroller 800 stores a shutdown indicator flag in the memory device 944 indicating that the plurality of FET switches 506 in the high side FET IC 450 and the plurality of FET switches 606 in the low side FET IC 452 have been transitioned to the open operational state, in response to receiving at least one of the second and fourth shutdown indicator voltages (SHUTDOWN_ISG_FETS_1_DSP) (SHUTDOWN_ISG_FETS_2_DSP). After step 1520, the method advances to step 1522.

At step 1522, the microcontroller 800 generates a first control voltage (SWITCH_LV_OFF_SIG) that is received at the pin 2 of the tri-state buffer IC 810 for commanding the low voltage switch 270 in the DC-DC voltage converter 54 to be transitioned to an open operational state. After step 1522, the method advances to step 1524.

At step 1524, the tri-state buffer IC 810 outputs a second control voltage (SWITCH_LV_OFF) at the pin 15 thereof in response to receiving the first control voltage (SWITCH_LV_OFF_SIG). The second control voltage (SWITCH_LV_OFF) is received by the low voltage switch 270 and induces the low voltage switch 270 to transition to the open operational state. After step 1524, the method advances to step 1526.

At step 1526, the microcontroller 800 generates a third control voltage (SWITCH_HV_OFF_SIG) that is received at the pin 2 of the tri-state buffer IC 812 for commanding the high voltage switch 200 in the DC-DC voltage converter 54 to be transitioned to the open operational state. After step 1526, the method advances to step 1528.

At step 1528, the tri-state buffer IC 812 outputs a fourth control voltage (SWITCH_HV_OFF) at the pin 15 thereof in response to receiving the third control voltage (SWITCH_HV_OFF_SIG). The fourth control voltage (SWITCH_HV_OFF) is received by the high voltage switch 200 and induces the high voltage switch 200 to transition to the open operational state. After step 1528, the method is exited.

Figure 5:
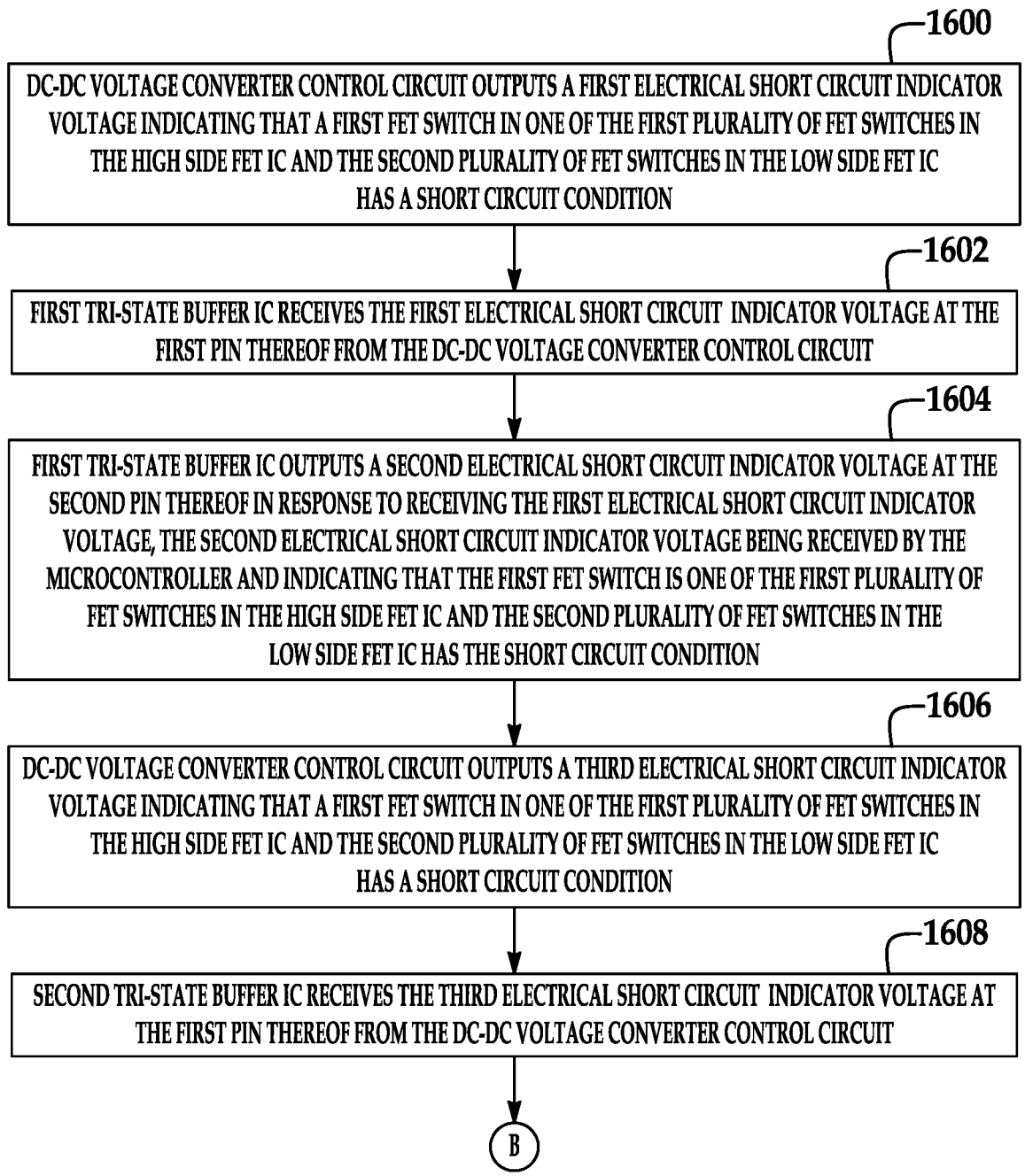
FIGS. 5-6 is a flowchart of a second diagnostic method performed by the diagnostic system of FIG. 1 in accordance with another exemplary embodiment.
Figure 6:
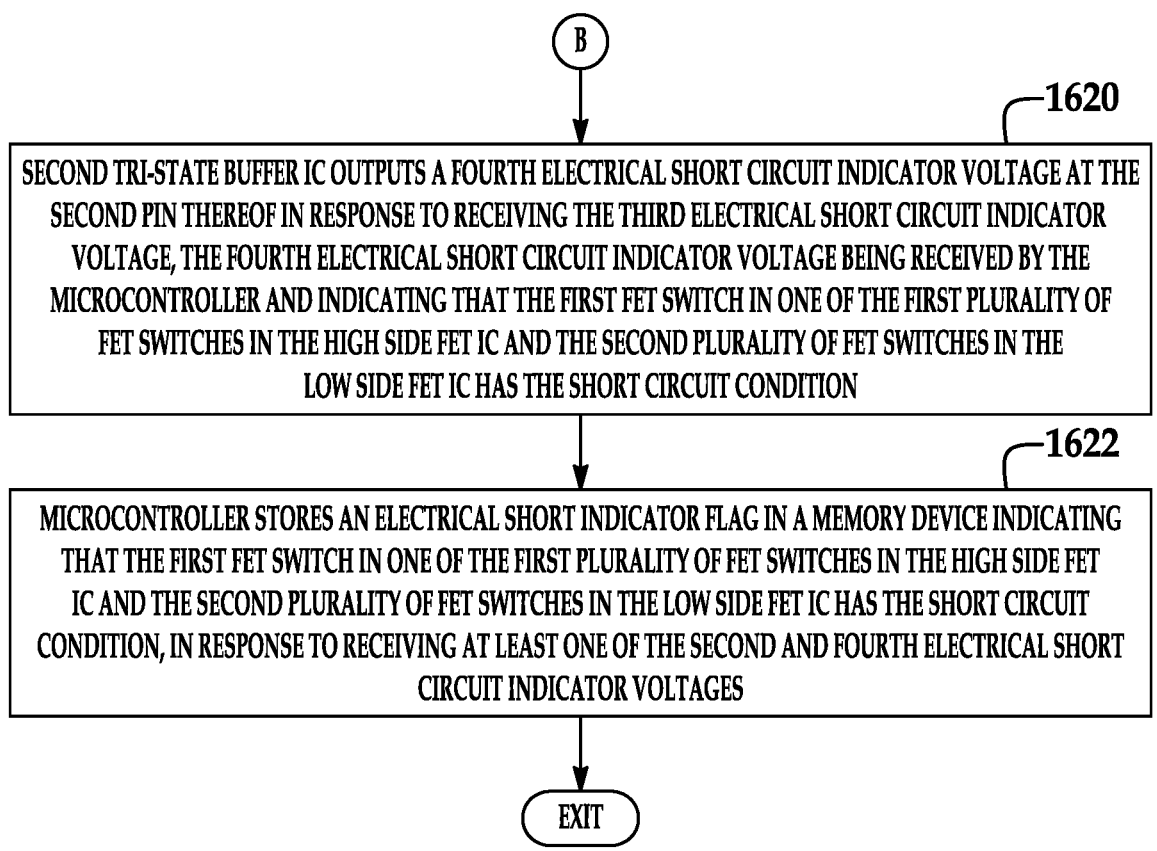

Referring to FIGS. 1, 5 and 6, a flowchart of a second diagnostic method for the DC-DC voltage converter 54 in accordance with another exemplary embodiment will be explained.

At step 1600, the DC-DC voltage converter control circuit 240 outputs a first electrical short circuit indicator voltage (TRIP_ARM_SHORT_1) indicating that a first FET switch in one of the plurality of FET switches 506 in the high side FET IC 450 and the plurality of FET switches 606 in the low side FET IC 452 has a short circuit condition. After step 1600, the method advances to step 1602.

At step 1602, the tri-state buffer IC 810 receives the first electrical short circuit indicator voltage (TRIP_ARM_SHORT_1) at a high logic level at the pin 8 thereof from the DC-DC voltage converter control circuit 240. After step 1602, the method advances to step 1604.

At step 1604, the tri-state buffer IC 810 outputs a second electrical short circuit indicator voltage (TRIP_ARM_SHORT_1_DSP) at a high logic level at the pin 12 thereof in response to receiving the first electrical short circuit indicator voltage (TRIP_ARM_SHORT_1) at the high logic level. The second electrical short circuit indicator voltage (TRIP_ARM_SHORT_1_DSP) is received by the microcontroller 800 and indicates that the first FET switch in one of the plurality of FET switches 506 in the high side FET IC 450 and the plurality of FET switches 606 in the low side FET IC 452 has the short circuit condition. After step 1604, the method advances to step 1606.

At step 1606, the DC-DC voltage converter control circuit 240 outputs a third electrical short circuit indicator voltage (TRIP_ARM_SHORT_2) at a high logic level indicating that the first FET switch in one of the plurality of FET switches 506 in the high side FET IC 450 and the plurality of FET switches 606 in the low side FET IC 452 has a short circuit condition. After step 1606, the method advances to step 1608.

At step 1608, the tri-state buffer IC 812 receives the third electrical short circuit indicator voltage (TRIP_ARM_SHORT_2) at the pin 8 thereof from the DC-DC voltage converter control circuit 240. After step 1608, the method advances to step 1620.

At step 1620, the tri-state buffer IC 812 outputs a fourth electrical short circuit indicator voltage (TRIP_ARM_SHORT_2_DSP) at a high logic level at the pin 12 thereof in response to receiving the third electrical short circuit indicator voltage (TRIP_ARM_SHORT_2) at the high logic level. The fourth electrical short circuit indicator voltage (TRIP_ARM_SHORT_2_DSP) is received by the microcontroller 800 and indicates that the first FET switch in one of the plurality of FET switches 506 in the high side FET IC 450 and the plurality of FET switches 606 in the low side FET IC 452 has the short circuit condition. After step 1620, the method advances to step 1622.

At step 1622, the microcontroller 800 stores an electrical short indicator flag in the memory device 944 indicating that the first FET switch in one of the plurality of FET switches 506 in the high side FET IC 450 and the plurality of FET switches 606 in the low side FET IC 452 has the short circuit condition, in response to receiving at least one of the second and fourth electrical short circuit indicator voltages (TRIP_ARM_SHORT_1_DSP) (TRIP_ARM_SHORT_2_DSP). After step 1622, the method is exited.

Figure 7:
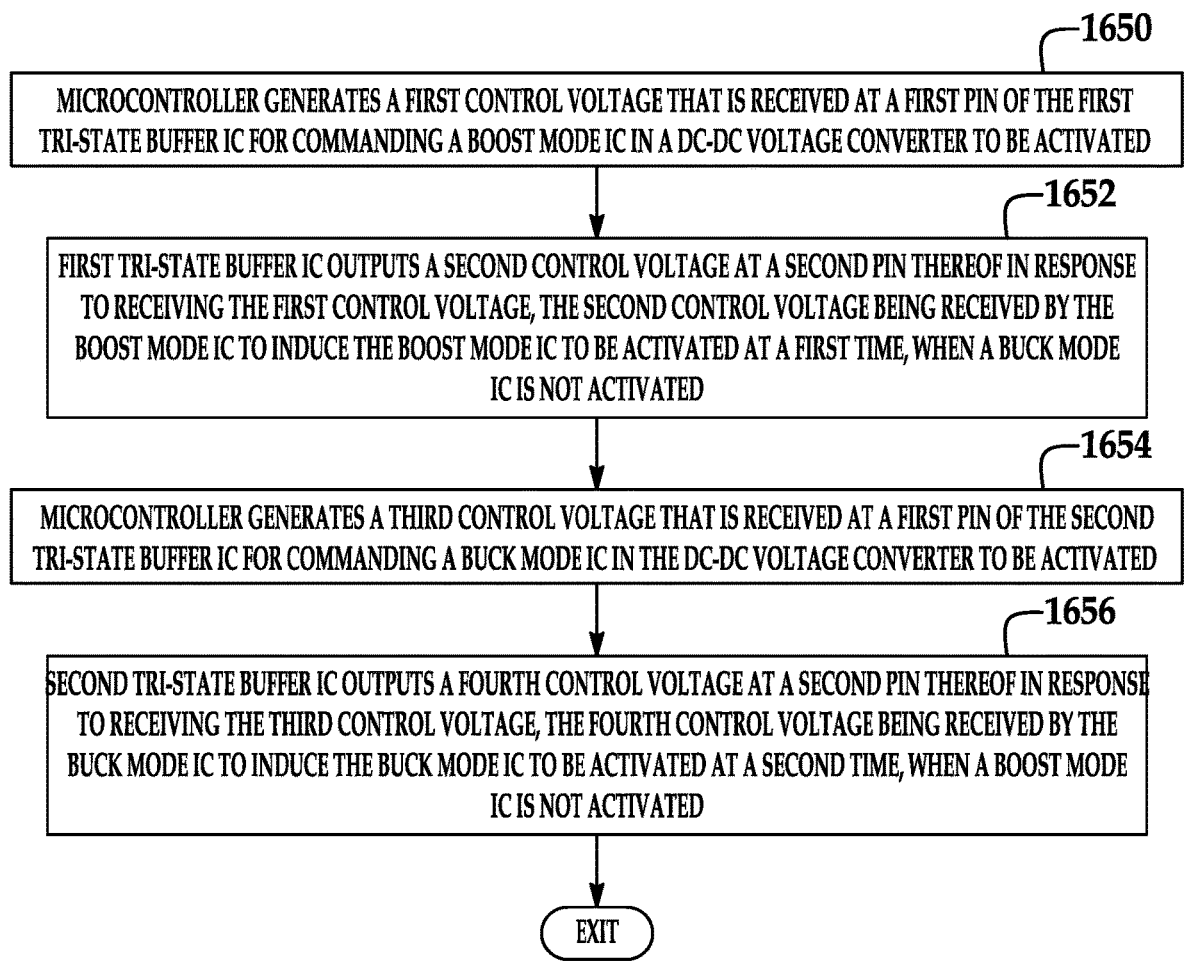
FIG. 7 is a flowchart of a third diagnostic method performed by the diagnostic system of FIG. 1 in accordance with another exemplary embodiment.

Referring to FIGS. 1 and 7, a flowchart of a third diagnostic method for the DC-DC voltage converter 54 in accordance with another exemplary embodiment will be explained.

At step 1650, the microcontroller 800 generates a first control voltage (BOOST_IC_ENABLE_DSP) at a high logic level that is received at a pin 9 of the tri-state buffer IC 810 for commanding a boost mode IC 454 in a DC-DC voltage converter 54 to be activated. After step 1650, the method advances to step 1652.

At step 1652, the tri-state buffer IC 810 outputs a second control voltage (BOOST_IC_ENABLE) at a high logic level at a pin 9 thereof in response to receiving the first control voltage (BOOST_IC_ENABLE_DSP) at a high logic level. The second control voltage (BOOST_IC_ENABLE) is received by the boost mode IC 454 to induce the boost mode IC 454 to be activated at a first time, when a buck mode IC 456 is not activated. After step 1652, the method advances to step 1654.

At step 1654, the microcontroller 800 generates a third control voltage (BUCK_IC_ENABLE_DSP) at a high logic level that is received at a pin 11 of the tri-state buffer IC 812 for commanding the buck mode IC in the DC-DC voltage converter 54 to be activated. After step 1654, the method advances to step 1656.

At step 1656, the tri-state buffer IC 812 outputs a fourth control voltage (BUCK_IC_ENABLE) at a high logic level at a pin 9 thereof in response to receiving the third control voltage (BUCK_IC_ENABLE_DSP) at a high logic level. The fourth control voltage (BUCK_IC_ENABLE) is received by the buck mode IC 456 to induce the buck mode IC 456 to be activated at a second time, when the boost mode IC 454 is not activated. After step 1656, the method is exited.

The diagnostic system described herein provides a substantial advantage over other diagnostic systems. In particular, the diagnostic system diagnostic system utilizes a pair of tri-state buffers to independently control switches and integrated circuits within the DC-DC voltage converter, and to receive diagnostic signals from the DC-DC voltage converter.

While the claimed invention has been described in detail in connection with only a limited number of embodiments, it should be readily understood that the invention is not limited to such disclosed embodiments. Rather, the claimed invention can be modified to incorporate any number of variations, alterations, substitutions or equivalent arrangements not heretofore described, but which are commensurate with the spirit and scope of the invention. Additionally, while various embodiments of the claimed invention have been described, it is to be understood that aspects of the invention may include only some of the described embodiments. Accordingly, the claimed invention is not to be seen as limited by the foregoing description.

What is claimed is:

1. A diagnostic system for a DC-DC voltage converter, comprising:
   the DC-DC voltage converter having a high voltage switch, a low voltage switch, a DC-DC voltage converter control circuit, a first electrical node, a second electrical node, a third electrical node, and a fourth electrical node;
   the high voltage switch being electrically coupled between and to the first and second electrical nodes;
   the low voltage switch being electrically coupled between and to the third and fourth electrical nodes;
   the DC-DC voltage converter control circuit being electrically coupled between and to the second and third electrical nodes;
   the DC-DC voltage converter control circuit having a high side FET IC and a low side FET IC;
   the high side FET IC having a first plurality of FET switches therein, the low side FET IC having a second plurality of FET switches therein, each FET switch of the first plurality of FET switches being electrically coupled to a respective FET switch of the second plurality of FET switches;
   a first tri-state buffer IC comprising a first pin, a second pin, a third pin, a fourth pin and a fifth pin; wherein the first pin receives a first shutdown indicator voltage, the second pin outputs a second shutdown indicator voltage, the third pin receives a first control voltage, the fourth pin outputs a second control voltage and the fifth pin is electrically coupled to an electrical ground;
   a second tri-state buffer IC comprising a first pin, a second pin, a third pin, a fourth pin and a fifth pin; wherein the first pin receives a third shutdown indicator voltage, the second pin outputs a fourth shutdown indicator voltage, the third pin receives a third control voltage, the fourth pin outputs a fourth control voltage and the fifth pin is electrically coupled to an electrical ground; and
   a microcontroller being electrically coupled to the first and second tri-state buffer ICs;
   the first tri-state buffer IC receiving the first shutdown indicator voltage at the first pin thereof from the DC-DC voltage converter control circuit indicating that the first plurality of FET switches in the high side FET IC and the second plurality of FET switches in the low side FET IC have been transitioned to an open operational state;
   the first tri-state buffer IC outputting the second shutdown indicator voltage at the second pin thereof in response to receiving the first shutdown indicator voltage, the second shutdown indicator voltage being received by the microcontroller and indicating that the first and second plurality of FET switches have been transitioned to the open operational state;
   the second tri-state buffer IC receiving the third shutdown indicator voltage at the first pin thereof from the DC-DC voltage converter control circuit indicating that the first and second plurality of FET switches have been transitioned to the open operational state;
   the second tri-state buffer IC outputting the fourth shutdown indicator voltage at the second pin thereof in response to receiving the third shutdown indicator voltage, the fourth shutdown indicator voltage being received by the microcontroller and indicating that the first and second plurality of FET switches have been transitioned to the open operational state; and
   the microcontroller storing a shutdown indicator flag in a memory device indicating that the first and second plurality of FET switches have been transitioned to the open operational state, in response to receiving at least one of the second and fourth shutdown indicator voltages.

2. The diagnostic system for the DC-DC voltage converter of claim 1, wherein the fourth shutdown indicator voltage is greater than the second shutdown indicator voltage.

3. The diagnostic system for the DC-DC voltage converter of claim 1, wherein:
   the microcontroller generating the first control voltage that is received at the third pin of the first tri-state buffer IC for commanding the low voltage switch to be transitioned to the open operational state;
   the first tri-state buffer IC outputting the second control voltage at the fourth pin thereof in response to receiving the first control voltage, the second control voltage inducing the low voltage switch to transition to the open operational state;
   the microcontroller generating the third control voltage that is received at the third pin of the second tri-state buffer IC for commanding the high voltage switch to be transitioned to the open operational state; and
   the second tri-state buffer IC outputting the fourth control voltage at the fourth pin thereof in response to receiving the third control voltage, the fourth control voltage inducing the high voltage switch to transition to the open operational state.

4. The diagnostic system for the DC-DC voltage converter of claim 3, wherein the fourth control voltage is greater than the second control voltage.

5. A diagnostic system for a DC-DC voltage converter, comprising: the DC-DC voltage converter having a high voltage switch, a low voltage switch, a DC-DC voltage converter control circuit, a first electrical node, a second electrical node, a third electrical node, and a fourth electrical node;
   the high voltage switch being electrically coupled between and to the first and second electrical nodes;
   the low voltage switch being electrically coupled between and to the third and fourth electrical nodes;
   the DC-DC voltage converter control circuit being electrically coupled between and to the second and third electrical nodes;
   the DC-DC voltage converter control circuit having a high side FET IC and a low side FET IC;

the high side FET IC having a first plurality of FET switches therein, the low side FET IC having a second plurality of FET switches therein, each FET switch of the first plurality of FET switches being electrically coupled to a respective FET switch of the second plurality of FET switches;

a first tri-state buffer IC comprising a first pin, a second pin, a third pin, a fourth pin and a fifth pin; wherein the first pin receives a first electrical short circuit indicator voltage, the second pin outputs a second electrical short circuit indicator voltage, the third pin receives a first control voltage, the fourth pin outputs a second control voltage and the fifth pin is electrically coupled to electrical ground;

a second tri-state buffer IC comprising a first pin, a second pin, a third pin, a fourth pin and a fifth pin; wherein the first pin receives a third electrical short circuit indicator voltage, the second pin outputs a fourth electrical short circuit indicator voltage, the third pin receives a third control voltage, the fourth pin outputs a fourth control voltage and the fifth pin is electrically coupled to an electrical ground; and a microcontroller being electrically coupled to the first and second tri-state buffer ICs;

the first tri-state buffer IC receiving the first electrical short circuit indicator voltage at the first pin thereof from the DC-DC voltage converter control circuit indicating that a first FET switch in one of the first plurality of FET switches in the high side FET IC and the second plurality of FET switches in the low side FET IC has a short circuit condition;

the first tri-state buffer IC outputting the second electrical short circuit indicator voltage at the second pin thereof in response to receiving the first electrical short circuit indicator voltage, the second electrical short circuit indicator voltage being received by the microcontroller and indicating that the first FET switch has the short circuit condition;

the second tri-state buffer IC receiving the third electrical short circuit indicator voltage at the first pin thereof from the DC-DC voltage converter control circuit indicating that the first FET switch has the short circuit condition;

the second tri-state buffer IC outputting the fourth electrical short circuit indicator voltage at the second pin thereof in response to receiving the third electrical short circuit indicator voltage, the fourth electrical short circuit indicator voltage being received by the microcontroller and indicating that the first FET switch has the short circuit condition; and the microcontroller storing an electrical short circuit indicator flag in a memory device indicating that the first FET switch has the short circuit condition, in response to receiving at least one of the second and fourth electrical short circuit indicator voltages.

6. The diagnostic system for the DC-DC voltage converter of claim 5, wherein the fourth electrical short circuit indicator voltage is greater than the second electrical short circuit indicator voltage.

\* \* \* \* \*